Figure 1:
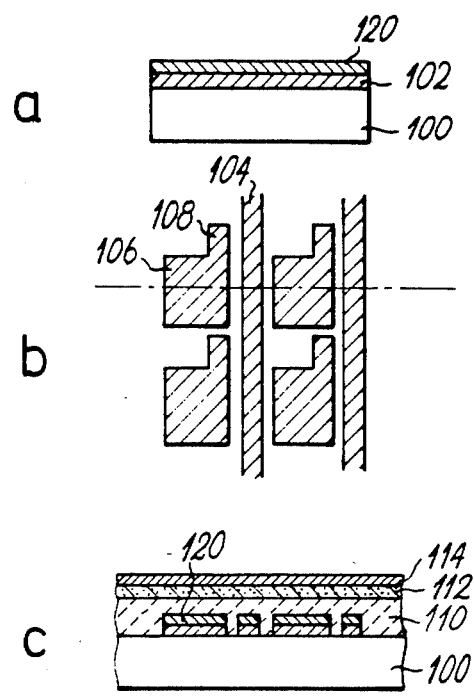
Figure 1:
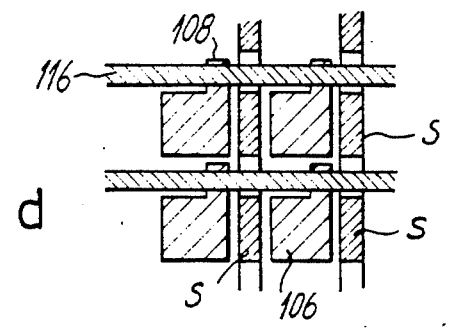

United States Patent [19]

Coissard et al.

[11] Patent Number: 4,689,116
[45] Date of Patent: Aug. 25, 1987

[54] PROCESS FOR FABRICATING ELECTRONIC CIRCUITS BASED ON THIN-FILM TRANSISTORS AND CAPACITORS

[75] Inventors: Pierre Coissard, Orange; Joseph Richard, Plourezre; Francois Morin, Lannion, all of France

[73] Assignee: L'Etat Francais represented by the Minister of PTT (Centre National d'Etudes des Telecommunications), Moulineaux, France

[21] Appl. No.: 882,905
[22] PCT Filed: Oct. 11, 1985
[86] PCT No.: PCT/FR85/00288
§ 371 Date: Jun. 16, 1986
§ 102(e) Date: Jun. 16, 1986
[87] PCT Pub. No.: WO86/02489
PCT Pub. Date: Apr. 24, 1986

[30] Foreign Application Priority Data
Oct. 17, 1984 [FR] France .................... 84 15898

[51] Int. Cl.⁴ .............. H01L 21/306; B44C 1/22; C03C 15/00; C23F 1/02
[52] U.S. Cl. .............................. 156/651; 437/919; 156/652; 156/656; 156/657; 156/659.1; 156/662; 156/607; 350/333; 357/4
[58] Field of Search ............ 156/651, 652, 653, 655, 156/656, 657, 659.1, 661.1, 662, 607; 29/578, 591; 427/90; 357/4, 2, 23.6, 71; 350/333

[56] References Cited

U.S. PATENT DOCUMENTS 4,331,758  5/1982  Luo ........................... 430/313
4,332,075  6/1982  Ota et al. ..................... 29/571
4,563,806  1/1986  Coissard et al. ............. 29/578 X

FOREIGN PATENT DOCUMENTS 0082783  6/1983  European Pat. Off. .

OTHER PUBLICATIONS

R. T. Gallagher, Electronics International, vol. 55, No. 10, Amorphous Silicon Enlarges LCD's ", pp. 94–96, May 19, 1982.

Primary Examiner—William A. Powell
Attorney, Agent, or Firm—Oblon, Fisher, Spivak, McClelland & Maier

[57] ABSTRACT

Process of fabricating an active matrix display screen in which there are left after the second photo-etching segments (S) forming conductive bridges (120, 110, 112, 114) over breaks (103) in the conductive layer (102) forming the columns.

1 Claim, 4 Drawing Figures

PROCESS FOR FABRICATING ELECTRONIC CIRCUITS BASED ON THIN-FILM TRANSISTORS AND CAPACITORS

Document FR-A-2 533 072 describes a process for fabricating an active matrix display screen in which there is produced a lower wall carrying capacitor plates and thin-film transistors and an upper wall coated with a counter-electrode forming the second plates of the capacitors. The process which is the subject matter of this document is characterised in that, to produce the lower wall, the following operations are carried out:

depositing a layer of a first transparent conductive material on an insulative substrate, photo-etching this first layer to constitute lines and columns of pads forming one of the plates of the eventual capacitors, each pad being joined to an appendix, this first photo-etching leaving also columns of said first conductive material disposed between the columns of pads, depositing a layer of hydrogenated amorphous silicon over everything, depositing an insulative layer, depositing a layer of a second conductive material, photo-etching the silicon layer/insulative layer/conductive layer assembly to leave lines of the second conductive material extending over the appendixes, the areas of overlap of a line with a column and an appendix defining the source and the drain of a transistor, the grid of the transistor consisting of the part of the line situated between the appendix and the column.

In a variation on this process and in order to improve the contact between the oxide and the aSiH layer, a highly n-doped amorphous silicon layer is deposited after the oxide. The first etching is still effected using the same mask, but affects both the doped silicon layer and the oxide layer. The second photo-etching is not changed.

An object of the present invention is a variation on this process using the doped amorphous silicon additional layer but in which the second photo-etching is slightly modified.

In the prior art document, the doped silicon is attacked after the semiconductor silicon during the second etching. Thus the doped silicon remains only beneath the grid, above the oxide (see FIG. 7b of the main patent).

Although the results obtained with the embodiment described in the prior art document have demonstrated the validity of the process and the benefits of its simplicity, the resulting screens may in some cases feature a few defects resulting from breaks in the columns. These breaks occur when there is used for the initial substrate a "Balzers" type glass covered with a very thin layer of indium-tin oxide. The "natural" fine scratches in these standard substrates (which are not expensive as they are already used in liquid crystal displays) prevent the formation of very fine strips (approximately 20 μm wide) with a yield of 100%. It is therefore necessary either to deposit the transparent and conductive layers onto better quality substrates or to introduce redundancy to compensate for the interrupted columns.

The second solution is used in the present invention.

Redundancy is obtained by slightly modifying the second level mask so that after etching there remains over part of the columns a stack formed by the n-doped silicon layer and the subsequent layers. Should the column be broken, a stack then acts as a conductive bridge between the two parts of it. There results an electrical redundancy in the design of the addressing columns since two conductors are provided in parallel, the second alleviating any defects of the first.

This solution has another advantage: the stack that remains results in optical masking of the transparent column. If the column is not masked it is visible in the same way as a display point. Its appearance depends on the average value of the video voltage during a picture. This effect is a considerable nuisance in white on black display mode, since the eye is highly sensitive to white lines, even if extremely fine. In the opposite mode, black and white, the effect is much less visible since a black line 20 μm wide on a white background is invisible to the eye. Optical masking of the transparent columns is therefore necessary, especially in the first mode, and is perfectly implemented by the present invention.

It will be noted that the improvement in accordance with the invention does not introduce any supplementary operation, since it is merely the design of the second level mask that is slightly modified.

Note also that in the case of very wide breaks the resistance of the doped silicon bridge may become high. The two parts of the column are nevertheless connected electrically by capacitive coupling.

In any event, the characteristics of the invention will emerge more clearly from the following description of one embodiment given by way of non-limiting explanatory example.

Figure 2:
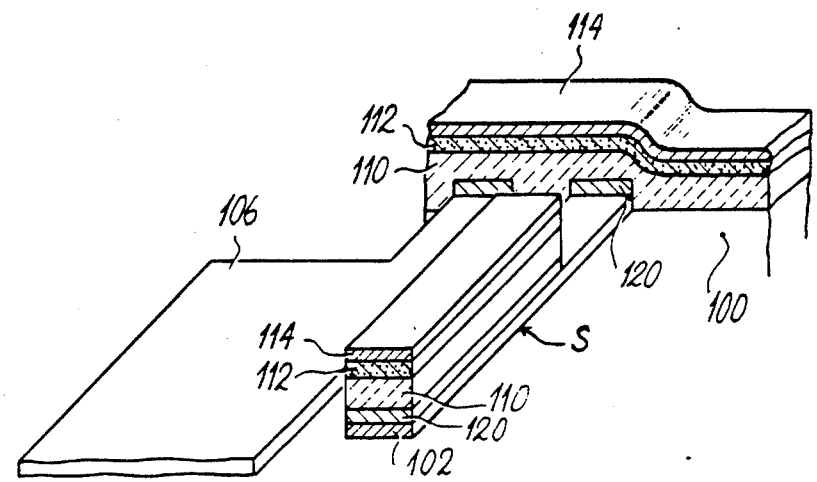
Figure 3:
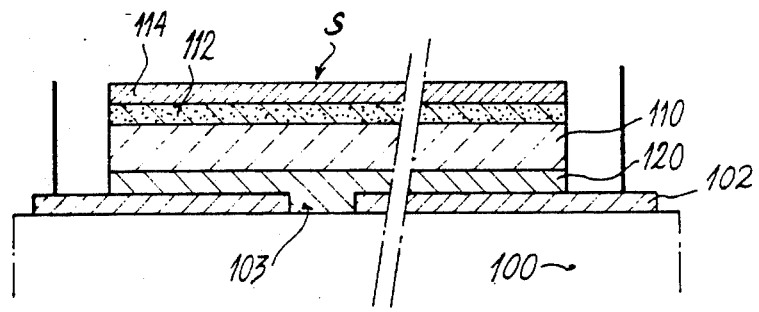
Figure 4:
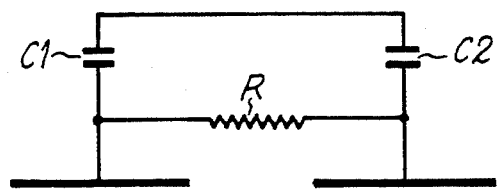

This description refers to the appended drawings, in which:

FIG. 1 shows the essential stages of the process in accordance with the invention, FIG. 2 shows one detail of the resulting screen, FIG. 3 shows in cross-section the segment which remains over the columns after the second etching, FIG. 4 is an equivalent electrical circuit diagram illustrating the principle of electrical redundancy introduced by the invention.

The various operations constituting the process in accordance with the invention are shown in FIG. 1, which represents the various intermediate states of the screen obtained. These operations are as follows:

depositing a layer 120 of highly n-doped amorphous silicon onto a glass substrate 100, as sold under the trade name Balzers, for example, previously coated with a layer 102 of transparent conductive material, for example tin and indium oxide, photo-etching these two layers to produce a mosaic of pads 106 arranged in lines and columns, these pads forming one of the plates of the eventual capacitors: each pad is joined to an appendix 108; this first photo-etching also leaves columns 104 of the first conductive material 102 overlaid by the layer 120 of highly n-doped amorphous silicon, these columns lying between the columns of pads (FIG. 1b), depositing a layer 110 of hydrogenated amorphous silicon over everything, depositing an insulative layer 112, of silica for example, depositing a layer 114 of a second conductive material, aluminium for example (FIG. 1c), photo-etching the layers 120, 110, 112 and 114 to expose each pad and leave lines 116 of the second conductive material 114; segments S of the stack remain over the columns, bridging part of the gaps separating two consecutive lines; this second photo-etching exposes the transparent conductive material 102 of the columns only at each end of these gaps (FIG. 1d), depositing a layer of SiO$_2$ to passivate the assembly.

The position and structure of the segments S remaining over the columns after the second photo-etching are better seen in FIGS. 2 and 3.

The role of this segment is explained with reference to FIGS. 3 and 4. FIG. 3 shows a column 102 featuring a break 103. The conductive bridge formed by the segment S and in particular by the highly doped amorphous silicon layer 120 re-establishes electrical continuity. If the break 103 is very wide, electrical continuity is nevertheless assured (despite the non-negligible resistance R of the segment of silicon carrying the break) by the two capacitors C$_1$ and C$_2$ formed by the two parts of the layer 102 and the conductive layer 114. The equivalent electrical circuit diagram is shown in FIG. 4.

What is claimed is:

1. Process for fabricating an active matrix display screen in which there is produced a lower wall carrying capacitor plates and thin-film transistors and an upper wall coated with a counter-electrode forming second capacitor plates, characterised in that, to produce the lower wall, the following operations are carried out:

a layer (120) of highly n-doped amorphous silicon is deposited on an insulative substrate (100) covered with a layer (102) of a first transparent conductive material, these two layers are photo-etched to constitute a mosaic of pads (106) arranged in lines and columns, these pads (106) forming one of the plates of the eventual capacitors, each pad being joined to an appendix (108), this first photo-etching also leaving columns (104) of said first conductive material overlaid by the layer (120) of highly n-doped amorphous silicon, these columns being situated between the columns of pads, depositing a layer (110) of hydrogenated amorphous silicon over everything, depositing an insulative layer (112), depositing a layer (114) of a second conductive material, photo-etching the stack of layers (120, 110, 112, 114) to expose each pad but so as to leave lines (116) of the second conductive material (114), this second photo-etching also leaving segments (S) of this stack over the columns over a part of the gaps between two consecutive lines, this second photo-etching exposing the transparent conductive material (102) of the columns only at each end of these gaps.

* * * * *